(12) United States Patent
Noh et al.

(10) Patent No.: US 7,371,499 B2
(45) Date of Patent: May 13, 2008

(54) PHOTORESIST RESIN COMPOSITION, METHOD OF FORMING A PHOTORESIST PATTERN, AND METHOD OF MANUFACTURING A DISPLAY SUBSTRATE USING THE SAME

(75) Inventors: Young-Tae Noh, Seoul (KR); Yun-Jung Na, Suwon-si (KR); Eun-Joon Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 21 days.

(21) Appl. No.: 11/550,897

(22) Filed: Oct. 19, 2006

(65) Prior Publication Data

US 2007/0128540 A1 Jun. 7, 2007

(30) Foreign Application Priority Data

Dec. 2, 2005 (KR) .................. 10-2005-0117111

(51) Int. Cl.
*G03F 7/023* (2006.01)
*G03F 7/32* (2006.01)

(52) U.S. Cl. .................. 430/191; 430/192; 430/193; 430/314; 430/318; 430/326; 430/330

(58) Field of Classification Search ............... 430/191, 430/192, 193, 314, 318, 326, 330
See application file for complete search history.

(56) References Cited

U.S. PATENT DOCUMENTS

| | | | |
|---|---|---|---|
| 4,906,458 A | * | 3/1990 | Shigeta et al. ............... 424/63 |
| 6,841,330 B2 | * | 1/2005 | Miyake et al. ............. 430/156 |
| 2004/0144753 A1 | * | 7/2004 | Kang et al. ................... 216/42 |
| 2005/0089790 A1 | * | 4/2005 | Lee et al. .................... 430/141 |

* cited by examiner

*Primary Examiner*—John S. Chu
(74) *Attorney, Agent, or Firm*—Cantor Colburn LLP

(57) ABSTRACT

A photoresist resin composition comprises about 10 to about 35% by weight of an acryl-based copolymer, about 5 to about 10% by weight of a quinone diazide compound, about 55 to about 80% by weight of a solvent, and about 0.01 to about 0.5% by weight of a silane-based surfactant where the weights of each of the acryl-based copolymer, quinone diazide compound, solvent, and silane-based surfactant are based on the total weight of acryl-based copolymer, quinone diazide compound, solvent, and silane-based surfactant. An overcoating layer formed using the photoresist resin composition has improved flatness, and thus defects on a display screen may be prevented and/or reduced.

21 Claims, 9 Drawing Sheets

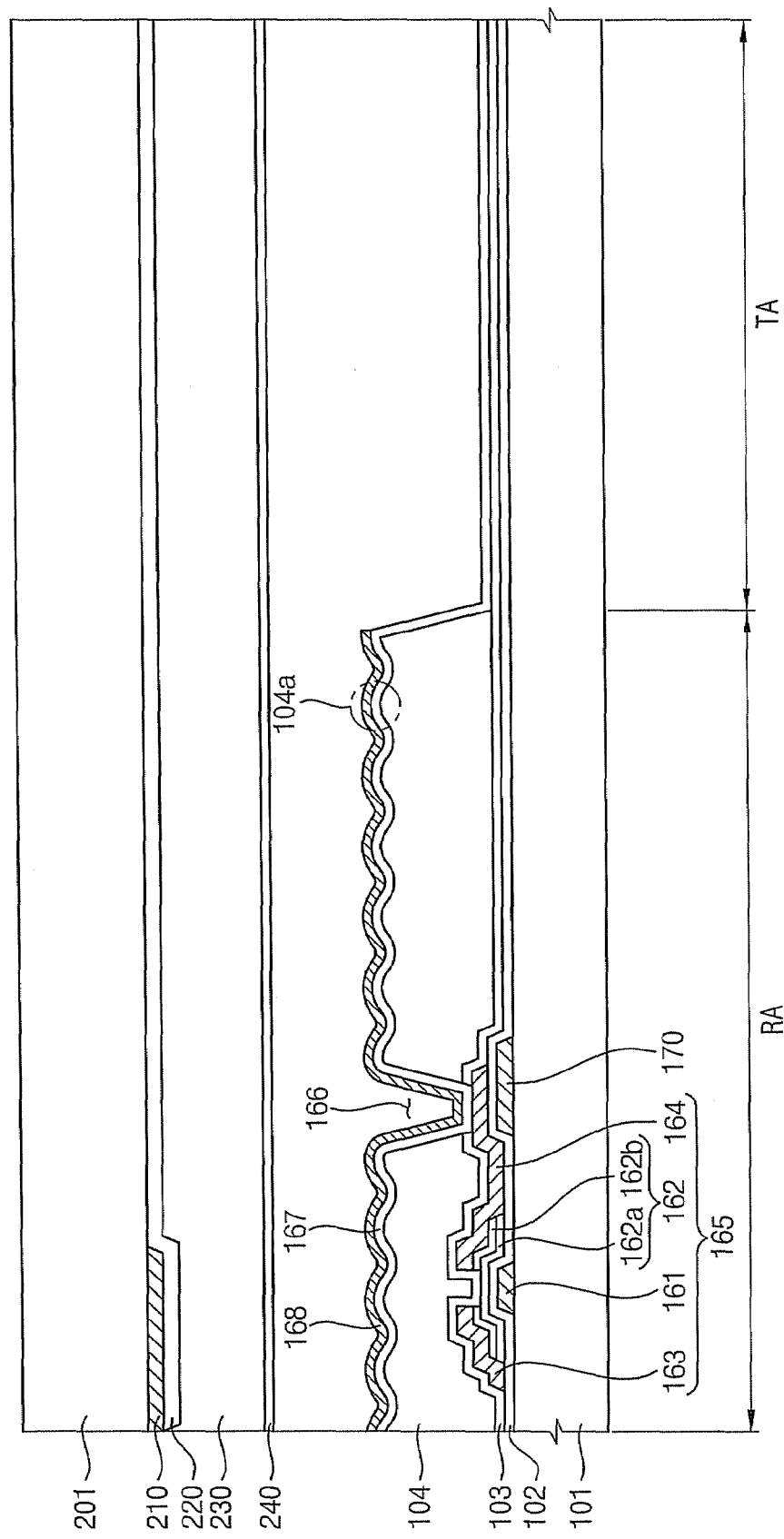

PHOTORESIST RESIN COMPOSITION, METHOD OF FORMING A PHOTORESIST PATTERN, AND METHOD OF MANUFACTURING A DISPLAY SUBSTRATE USING THE SAME

CROSS-REFERENCE TO RELATED APPLICATIONS

This application claims priority to Korean Patent Application No. 2005-117111, filed on Dec. 2, 2005, and all the benefits accruing therefrom under 35 U.S.C. § 119(a), the contents of which are incorporated herein by reference in its entirety.

BACKGROUND OF THE INVENTION

1. Field of the Invention

The present invention relates to a photoresist resin composition, a method of forming a photoresist pattern, and a method of manufacturing a display substrate using the photoresist resin composition. More particularly, the present invention relates to a photoresist resin composition capable of improving fluidity and coating stability, a method of forming a photoresist pattern, and a method of manufacturing a display substrate using the photoresist resin composition.

2. Description of the Related Art

In general, a liquid crystal display ("LCD") apparatus includes a display substrate, a counter substrate, a display panel and a liquid crystal layer interposed between the display substrate and the counter substrate. The display substrate includes a plurality of pixel areas defined by gate lines, and data lines crossing the gate lines. A switching device is disposed in each of the pixel areas. An overcoating layer is disposed on the pixel areas to insulate the gate and data lines and/or to planarize a surface of the display substrate. The overcoating layer is formed by coating a photoresist resin composition using a spin coater and by curing the photoresist resin composition.

A conventional photoresist resin composition has relatively low fluidity, i.e., ability to flow over a desired surface, and relatively low coating stability. Thus, when an overcoating layer is formed using the conventional photoresist resin composition, the flatness of the exposed surface of the overcoating layer is reduced (i.e., surface roughness of the coated resist increases). An LCD apparatus having the overcoating layer has problems, such as defects having slanted line shapes on a display screen.

SUMMARY OF THE INVENTION

The present invention provides a photoresist resin composition capable of improving fluidity and coating stability.

The present invention also provides a method of forming a photoresist pattern using the above-mentioned photoresist resin composition.

The present invention also provides a method of manufacturing a display substrate using the above-mentioned photoresist resin composition.

In an embodiment, the photoresist resin composition includes (A) about 10 to about 35% by weight of an acryl-based copolymer comprising monomers including about 5 to about 40% by weight of an unsaturated carboxylic acid, about 10 to about 70% by weight of an unsaturated compound containing an epoxy group, and about 10 to about 70% by weight of an unsaturated olefin-based compound, based on the total weight of monomer, (B) about 5 to about 10% by weight of a quinone diazide compound, (C) about 55 to about 80% by weight of a solvent, and (D) about 0.01 to about 0.5% by weight of a silane-based surfactant represented by Chemical Formula (1):

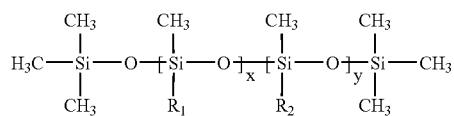

wherein $R_1$ represents an ethylene oxide group, $R_2$ represents a propylene oxide group, and X and Y represent integers of about 1 to about 20, and the weights of each of the acryl-based copolymer, quinone diazide compound, solvent, and silane-based surfactant are based on the total weight of acryl-based copolymer, quinone diazide compound, solvent, and silane-based surfactant.

In another aspect, a method of forming a photoresist pattern is provided. In the method, a photoresist resin composition is coated on a surface of a substrate to form a photoresist layer. The photoresist resin composition includes about 10 to about 35% by weight of an acryl-based copolymer, about 5 to about 10% by weight of a quinone diazide compound, about 55 to about 80% by weight of a solvent, and about 0.01 to about 0.5% by weight of a silane-based surfactant represented by Chemical Formula (1), wherein the weights of each of the acryl-based copolymer, quinone diazide compound, solvent, and silane-based surfactant are based on the total weight of acryl-based copolymer, quinone diazide compound, solvent, and silane-based surfactant. The photoresist layer is patterned to form a predetermined pattern.

In still another aspect of the present invention, a method of manufacturing a display substrate is provided. In the method, a gate metal pattern including a gate electrode, a gate line and a storage line is formed on a base substrate. A gate-insulating layer is formed on the gate metal pattern. An amorphous silicon layer and an $n^+$ amorphous silicon layer are sequentially formed on the gate-insulating layer to form a channel layer corresponding to the gate electrode. A source metal pattern including a source electrode, a source line and a drain electrode is formed on the gate-insulating layer having the channel layer. A photoresist resin composition is coated on the source metal pattern and the gate-insulating layer. The photoresist resin composition includes about 10 to about 35% by weight of an acryl-based copolymer, about 5 to about 10% by weight of a quinone diazide compound, about 55 to about 80% by weight of a solvent, and about 0.01 to about 0.5% by weight of a silane-based surfactant represented by the Chemical Formula (1), wherein the weights of each of the acryl-based copolymer, quinone diazide compound, solvent, and silane-based surfactant are based on the total weight of acryl-based copolymer, quinone diazide compound, solvent, and silane-based surfactant. A portion of the photoresist resin composition is removed to form an overcoating layer having a contact hole to expose a portion of the drain electrode. A pixel electrode electrically connected to the drain electrode through the contact hole is formed.

According to the above, an overcoating layer having a relatively high degree of flatness may be obtained. Therefore, defects on a display screen may be prevented and/or reduced.

BRIEF DESCRIPTION OF THE DRAWINGS

The above and other advantages of the present invention will become readily apparent by reference to the following detailed description when considered in conjunction with the accompanying drawings wherein:

FIG. 8 is a cross-sectional view illustrating a transflective LCD panel according to another exemplary embodiment of the present invention.

DESCRIPTION OF THE INVENTION

Figure 1:
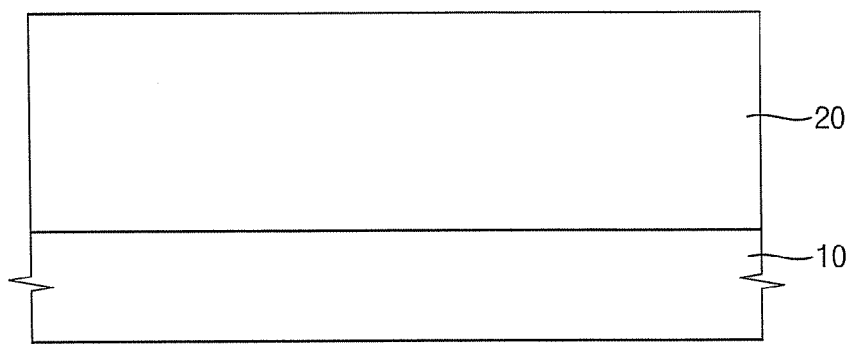
FIGS. 1 to 3 are cross-sectional views illustrating a method of forming a photoresist pattern according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the absolute and relative sizes of layers and regions may be exaggerated for clarity.

It will be understood that when an member or layer is referred to as being "on," "connected to" or "coupled to" another member or layer, it can be directly on, connected or coupled to the other member or layer or intervening members or layers may be present. In contrast, when a member is referred to as being "directly on," "directly connected to" or "directly coupled to" another member or layer, there are no intervening members or layers present. Like reference numbers in the drawings refer to like members throughout. As used herein, the term "and/or" includes any and all combinations of one or more of the associated listed items.

It will be understood that, although the terms first, second, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the present invention.

Spatially relative terms, such as "beneath," "below," "lower," "above," "upper" and the like, may be used herein for ease of description to describe one member or feature's relationship to another member(s) or feature(s) as illustrated in the figures. It will be understood that the spatially relative terms are intended to encompass different orientations of the device in use or operation in addition to the orientation depicted in the figures. For example, if the device in the figures is turned over, members described as "below" or "beneath" other members or features would then be oriented "above" the other members or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an", and "the" are intended to include the plural forms as well, unless the context clearly indicates otherwise. It will be further understood that the terms "comprise", "comprises", and/or "comprising," when used in this specification, specify the presence of stated features, integers, steps, operations, members, and/or components, but do not preclude the presence or addition of one or more other features, integers, steps, operations, members, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Photoresist Resin Composition

A photoresist resin composition includes about 10 to about 35% by weight of an acryl-based copolymer, about 5 to about 10% by weight of a quinone diazide compound, about 55 to about 80% by weight of a solvent, and about 0.01 to about 0.5% by weight of a silane-based surfactant, wherein the weights of each of the acryl-based copolymer, quinone diazide compound, solvent, and silane-based surfactant are based on the total weight of acryl-based copolymer, quinone diazide compound, solvent, and silane-based surfactant.

(A) Acryl-Based Copolymer

An acryl-based copolymer may serve to prevent and/or reduce scum on a surface of a photoresist layer in a developing process.

The acryl-based copolymer may be prepared by radical polymerization of a) an unsaturated carboxylic acid, b) an unsaturated compound containing an epoxy group and c) an unsaturated olefin-based compound as monomers, in the presence of a solvent and a polymerizing initiator.

When a content of the unsaturated carboxylic acid is less than about 5% by weight based on a total weight of the monomers, the thus-prepared copolymer may be difficult to dissolve in an aqueous alkaline solution. When the content of the unsaturated carboxylic acid is greater than about 40% by weight based on the total weight of the monomers, the solubility of the thus-prepared copolymer may be excessively high. Therefore, the content of the unsaturated carboxylic acid is about 5 to about 40% by weight based on the total weight of the monomers, and preferably about 10 to about 30% by weight based on the total weight of the monomers.

Examples of the unsaturated carboxylic acid may include acrylic acid, methacrylic acid, maleic acid, fumaric acid, citraconic acid, mesaconic acid, itaconic acid, etc. These can be used alone or in a mixture comprising at least one of the foregoing unsaturated carboxylic acids.

When a content of the unsaturated compound containing an epoxy group is less than about 10% by weight based on the total weight of the monomers, the heat resistance of the thus-formed pattern may deteriorate. When the content of the unsaturated compound containing an epoxy group is greater than about 70% by weight based on the total weight of the monomers, the heat resistance of the thus-formed pattern may deteriorate. Therefore, the content of the unsaturated compound containing an epoxy group is preferably about 10 to about 70% by weight based on the total weight of the monomers, and more preferably about 20 to about 60% by weight based on the total weight of the monomers.

Examples of the unsaturated compound containing an epoxy group may include glycidyl acrylate, glycidyl methacrylate, α-ethylglycidyl acrylate, α-n-propylglycidyl acrylate, α-n-butylglycidyl acrylate, β-methylglycidyl acrylate, α-methylglycidyl methacrylate, β-ethylglycidyl acrylate, β-ethylglycidyl methacrylate, 3,4-epoxybutyl acrylate, 3,4-epoxybutyl methacrylate, 6,7-epoxyheptyl acrylate, 6,7-epoxyheptyl methacrylate, α-ethyl-6,7-epoxyheptyl acrylate, o-vinylbenzyl glycidyl ether, m-vinylbenzyl glycidyl ether, p-vinylbenzyl glycidyl ether, and the like. These can be used alone or in a mixture comprising at least one of the foregoing unsaturated compounds. Among the unsaturated compound containing an epoxy group, glycidyl methacrylate, β-methylglycidyl acrylate, 6,7-epoxyheptyl acrylate, o-vinylbenzyl glycidyl ether, m-vinylbenzyl glycidyl ether, p-vinylbenzyl glycidyl ether, and the like, may improve the degree of polymerization and the heat resistance of a pattern formed using the photoresist resin composition.

When a content of the unsaturated olefin-based compound is less than about 10% by weight based on the total weight of the monomers, the storage stability (sometimes referred to as "shelf life") of the thus-prepared copolymer, and of a photoresist resin composition prepared therefrom, may deteriorate. When the content of the unsaturated olefin-based compound is greater than about 70% by weight based on the total weight of the monomers, the copolymer may be difficult to dissolve in an aqueous alkaline solution. Therefore, the content of the unsaturated olefin-based compound is preferably about 10 to about 70% by weight based on the total weight of the monomers, and more preferably about 20 to about 50% by weight.

Examples of the unsaturated olefin-based compound may include methyl methacrylate, ethyl methacrylate, n-butyl methacrylate, sec-butyl methacrylate, tert-butyl methacrylate, methyl acrylate, isopropyl acrylate, cyclohexyl methacrylate, 2-methyl cyclohexyl methacrylate, dicyclopentanyl oxyethyl methacrylate, isobornyl methacrylate, cyclohexyl acrylate, 2-methyl cyclohexyl acrylate, dicyclopentenyl acrylate, dicyclopentanyl acrylate, dicyclopentenyl methacrylate, dicyclopentanyl methacrylate, dicyclopentanyl oxyethyl acrylate, isobornyl acrylate, phenyl methacrylate, phenyl acrylate, benzyl acrylate, benzyl methacrylate, 2-hydroxyethyl methacrylate, styrene, α-methyl styrene, m-methyl styrene, p-methyl styrene, vinyl toluene, 1,3-butadiene, isoprene, 2,3-dimethyl-1,3-butadiene, and the like. These can be used alone or in a mixture comprising at least one of the foregoing olefin-based compounds.

Examples of the radical initiator may include 2,2'-azobis(isobutyronitrile), 2,2'-azobis(2,4-dimethyl valeronitrile), 2,2'-azobis(4-methoxy-2,4-dimethyl valeronitrile), 1,1'-azobis(cyclohexane-1-carbonitrile), dimethyl-2,2'-azobis(isobutyrate), and the like. These can be used alone or in a mixture comprising at least one of the foregoing initiators.

The acryl-based copolymer may have a weight-average molecular weight (Mw) of about 5,000 to about 30,000, and preferably about 5,000 to about 20,000. When the Mw is less than about 5,000, developing characteristics of the acryl-based copolymer and a photoresist resin composition prepared therefrom (i.e., the behavior of the acryl-based copolymer and photoresist coating during development using an aqueous alkaline developer) and the residual layer characteristics (i.e., post-develop properties of the developed features such as, for example, surface roughness, unexposed film thickness loss, and the like) may diminish. Furthermore, pattern shape, heat resistance, and other properties of the developed photoresist coating, may deteriorate. When the Mw is greater than about 30,000, the sensitivity of the photoresist coating containing the acryl-based copolymer may decrease and/or the pattern shape may deteriorate.

(B) Quinone Diazide Compound

A photoresist resin composition according to an embodiment of the present invention includes a quinone diazide compound as a photosensitive compound.

For example, in an exemplary embodiment, the quinone diazide compound may include 1,2-quinone diazide-4-sulfonic acid ester, 1,2-quinone diazide-5-sulfonic acid ester, 1,2-quinone diazide-6-sulfonic acid ester, and the like, or a mixture comprising at least one of the foregoing quinone diazide compounds.

The quinone diazide compound may be prepared by reacting a naphthoquinone diazide sulfonic acid halogen compound with a phenol compound in the presence of a weak base as a proton scavenger such as, for example, triethylamine, and a non-reacting water-miscible solvent such as, for example, acetone.

A preferred degree of esterification degree may be about 50 to about 85% of the available phenolic reactive sites, based on the total number of phenolic reactive sites on the phenol compound. When the degree of esterification is less than about 50%, residual layer characteristics may deteriorate. When the degree of esterification is greater than 85%, the storage stability of the product may be decreased.

When a content of the quinone diazide compound is less than about 5% by weight based on a total weight of the photoresist resin composition, the solubility difference between an exposed portion and unexposed portion of a photoresist layer may become small so that the formation of a photoresist pattern after exposure and development is difficult. When the content of the quinone diazide compound is greater than about 10% by weight based on the total weight of the photoresist resin composition, a large amount of unreacted quinone diazide compound may remain after exposure of the photoresist layer to light for a time period otherwise sufficient to provide an imaged feature in the photoresist layer. Thus, the solubility of the exposed portion in aqueous alkaline solution may be too low, and the exposed portion may thus be hindered from development. Therefore, the content of the quinone diazide compound is about 5 to about 10% by weight based on the total weight of the photoresist resin composition, and preferably about 5 to about 8% by weight based on the total weight of the photoresist resin composition.

(C) Surfactant

The surfactant improves coating characteristics and developing characteristics of the photoresist resin composition. The surfactant includes a silane-based surfactant represented by Chemical Formula (1):

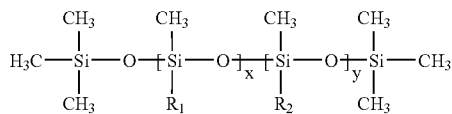

wherein $R_1$ represents an ethylene oxide group, $R_2$ represents a propylene oxide group, and X and Y represent integers from about 1 to about 20.

The content of the surfactant is about 0.01 to about 0.5% by weight based on the total weight of the photoresist resin composition, and preferably about 0.025 to about 0.3% by weight based on the total weight of the photoresist resin composition.

(D) Solvent

Examples of solvents include a diethylene glycol solvent such as diethylene glycol monomethyl ether, diethylene glycol monoethyl ether, diethylene glycol dimethyl ether, diethylene glycol diethyl ether, diethylene glycol methyl ethyl ether, and the like. These can be used alone or in a mixture comprising at least one of the foregoing solvents. Diethylene glycol solvents are advantageous in terms of solute solubility, reactivity, fluidity, coating stability, evaporation rate, and other solvent properties useful for the photoresist resin composition.

The solids content of the photoresist resin composition may be about 30 to about 70% by weight. The photoresist resin composition may be purified by filtering to remove particulate contaminants that can cause defects in the photoresist layer after coating. In an exemplary embodiment, the photoresist resin composition is filtered using a Millipore filter having an average pore size of about 0.1 to about 0.2 μm.

The photoresist resin composition may further include additives for imparting desirable properties to a photoresist layer prepared therefrom such as, for example, etch and/or solvent resistance, surface adhesion, feature resolution, dissolution rate control, and the like. Exemplary additives for use in the photoresist composition may include a melamine resin, an adhesive, an acryl-based compound, or other desirable additives. These can be used alone or in a mixture comprising at least one of the foregoing additives.

The additive may be present in an amount of about 2 to about 3% by weight based on the total weight of the photoresist resin composition.

Melamine resin may increase the heat resistance and the sensitivity of a pattern formed using the photoresist resin composition. The melamine resin may be present in an amount of about 20 to about 30% by weight based on the total weight of additive.

An adhesive increases an adhesive strength between the photoresist resin composition and a substrate. The content of the adhesive may preferably be about 45 to about 55% by weight based on the total weight of additive, and more preferably about 50% by weight. Examples of the adhesive may include a silane coupling agent having a reactive substituent such as carboxy group, methacryl group, isocyanate group, epoxy group, and the like. More particularly, the adhesive may include γ-methacryl propyl trimethoxy silane, vinyl triacetoxy silane, vinyl trimethoxy silane, γ-isocyanate propyl triethoxy silane, γ-glycidoxy propyl trimethoxy silane, β-(3,4-epoxy cyclohexyl)ethyl trimethoxy silane, and the like. These can be used alone or in a mixture comprising at least one of the foregoing adhesives.

An acryl-based compound may improve the transmittance, the heat resistance, the sensitivity, and/or other properties, of a pattern formed using the photoresist resin composition. The content of the acryl-based compound may be about 25 to about 30% by weight based on the total weight of additive.

Method of Forming a Photoresist Pattern

A method of forming a photoresist pattern according to an exemplary embodiment of the present invention is described more fully hereinafter.

Figure 2:
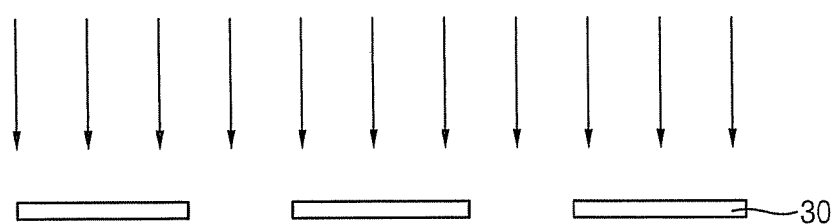
Figure 2:
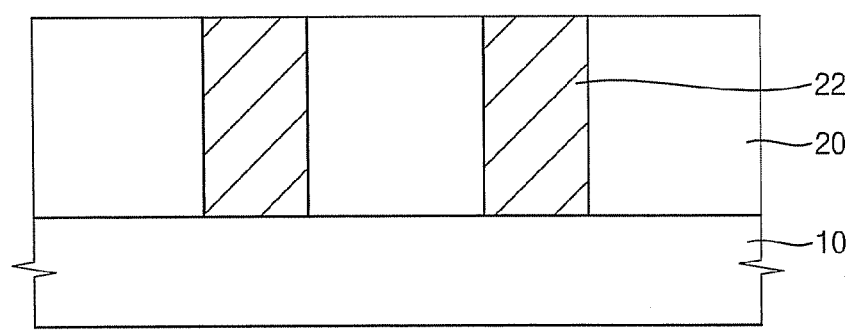
Figure 3:
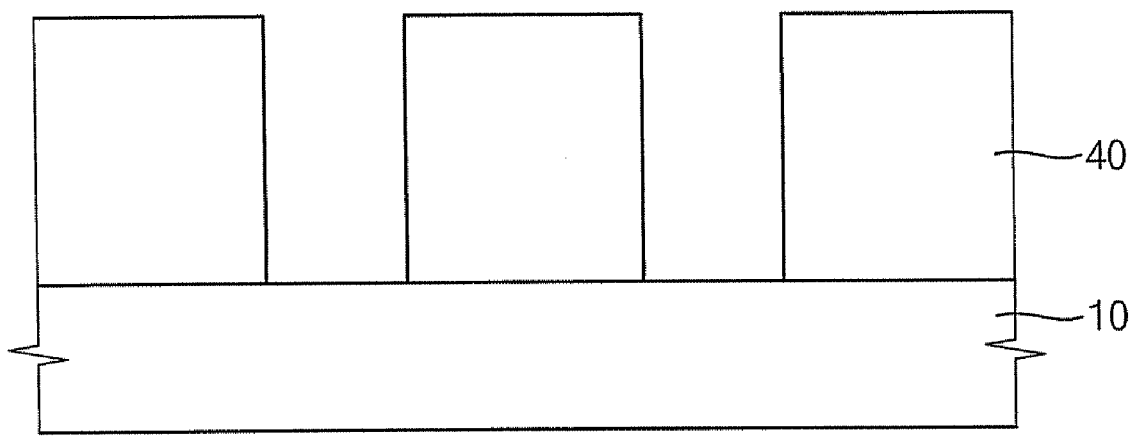

FIGS. 1 to 3 are cross-sectional views illustrating a method of forming a photoresist pattern according to an exemplary embodiment of the present invention.

Referring to FIG. 1, a photoresist layer 20 is formed by coating a photoresist resin composition on a surface of a substrate 10 such as a glass substrate, or other substrate, to form a photoresist layer 20. The photoresist resin composition includes about 10 to about 35% by weight of an acryl-based copolymer, about 5 to about 10% by weight of a quinone diazide compound, about 55 to about 80% by weight of a solvent, and about 0.01 to about 0.5% by weight of a silane-based surfactant, wherein the weights of each of the acryl-based copolymer, quinone diazide compound, solvent, and silane-based surfactant are based on the total weight of acryl-based copolymer, quinone diazide compound, solvent, and silane-based surfactant. For example, the photoresist layer 20 is formed by a spin-coating method. In particular, the substrate 10 is supported by a spin chuck that rotates at high speeds of up to about 5,000 rpm, and more specifically at speeds of about 800 to about 2,000 rpm. While the substrate is rotating, the photoresist resin composition is uniformly coated on a surface of the substrate 10 to form the photoresist layer 20.

The acryl-based copolymer may be prepared by copolymerization of monomers including about 5 to about 40% by weight of an unsaturated carboxylic acid, about 10 to about 70% by weight of an unsaturated compound containing an epoxy group, and about 10 to about 70% by weight of an unsaturated olefin-based compound, based on the total weight of monomer. The acryl-based copolymer may have a weight-average molecular weight (Mw) of about 5,000 to about 30,000.

The silane-based surfactant is represented by Chemical Formula (1):

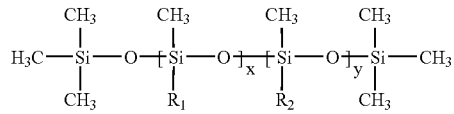

wherein $R_1$ represents an ethylene oxide group, $R_2$ represents a propylene oxide group, and X and Y represent integers of about 1 to about 20.

After forming the photoresist layer 20, the photoresist layer 20 is pre-baked (also referred to as "soft-baked") to remove the solvent. The pre-baking process may preferably be performed at a temperature lower than the temperature used in a subsequent curing process. For example, the pre-baking process may be performed at a temperature of about 80 to about 110° C. for about 1 to about 15 minutes. The pre-baking process removes all or part of the solvent in the photoresist layer and enhances adhesive characteristics between the photoresist layer 20 and the substrate 10.

After the pre-baking process, a portion of the photoresist layer 20 is removed in a photolithographic process. Removal of a portion of the photoresist layer 20 by this process is described more fully hereinafter.

Referring to FIG. 2, the photoresist layer 20 is selectively exposed to light through a mask 30. Particularly, the mask 30 including a predetermined pattern is positioned on a mask stage of an exposing apparatus. An aligning process that aligns the mask on the substrate 10 having the photoresist layer 20 is performed. The mask 30 is exposed to the light for a predetermined time so that a predetermined portion (i.e., the unmasked portion) of the photoresist layer 20 formed on the substrate 10 reacts photolytically upon exposure to the light passing through the mask 30.

Examples of the light that may be used for the exposing process include mercury vapor lamp emission lines including g-line ray at a wavelength of 436 nm or an i-line ray at a wavelength of 365 nm, a krypton fluoride excimer laser emission at a wavelength of 248 nm, an argon fluoride excimer laser emission at a wavelength of 193 nm, an electron beam (e-beam), an X-ray, and the like.

The portion 22 of the photoresist layer 20 that has been exposed to the light has a solubility (e.g., in aqueous alkaline solution) that is different from the unexposed portion of photoresist layer 20.

Referring to FIG. 3, the photoresist layer 20 exposed to the light is developed. Particularly, a photoresist pattern 40 (FIG. 3) is formed by removing the portion 22 of the photoresist layer 20 (as shown in FIG. 2) using a developing solution. Examples of the developing solution that may be used for removing the portion 22 of the photoresist layer 20 may include an alkaline compound, such as potassium hydroxide, tetramethyl ammonium hydroxide, etc. The developing solution may be dissolved in pure water. The content of the alkaline compound is about 0.01 to about 10% by weight based on a total weight of the developing solution. The developing solution may further include a surfactant and/or an organic solvent such as methanol, ethanol, and the like. After the developing process, the developed photoresist layer is rinsed using pure water for about 30 to about 90 seconds to remove post-develop residues, and is then dried to form the photoresist pattern 40 on substrate 10 (in FIG. 3).

A curing process that cures the photoresist pattern 40 in FIG. 3 may be performed. A cross-link of thermosetting resins in the photoresist pattern 40 may be formed through the curing process. The curing process may be performed at a temperature of about 150 to about 250° C. for about 30 to about 90 minutes.

The photoresist pattern 40 may be further treated by performing appropriate additional processes such rinsing after cure to remove impurities.

The photoresist resin composition has advantageous properties in terms of fluidity, coating stability, sensitivity, resolution, heat resistance, transmittance and heat discoloration resistance. Thus, the photoresist pattern 40 formed using the photoresist resin composition is advantageous for patterning.

In an example of the invention, a transflective liquid crystal display (LCD) panel having an overcoating layer, and formed using the photoresist resin composition according to an exemplary embodiment, is described more fully hereinafter.

Transflective Liquid Crystal Display Panel

Figure 4:
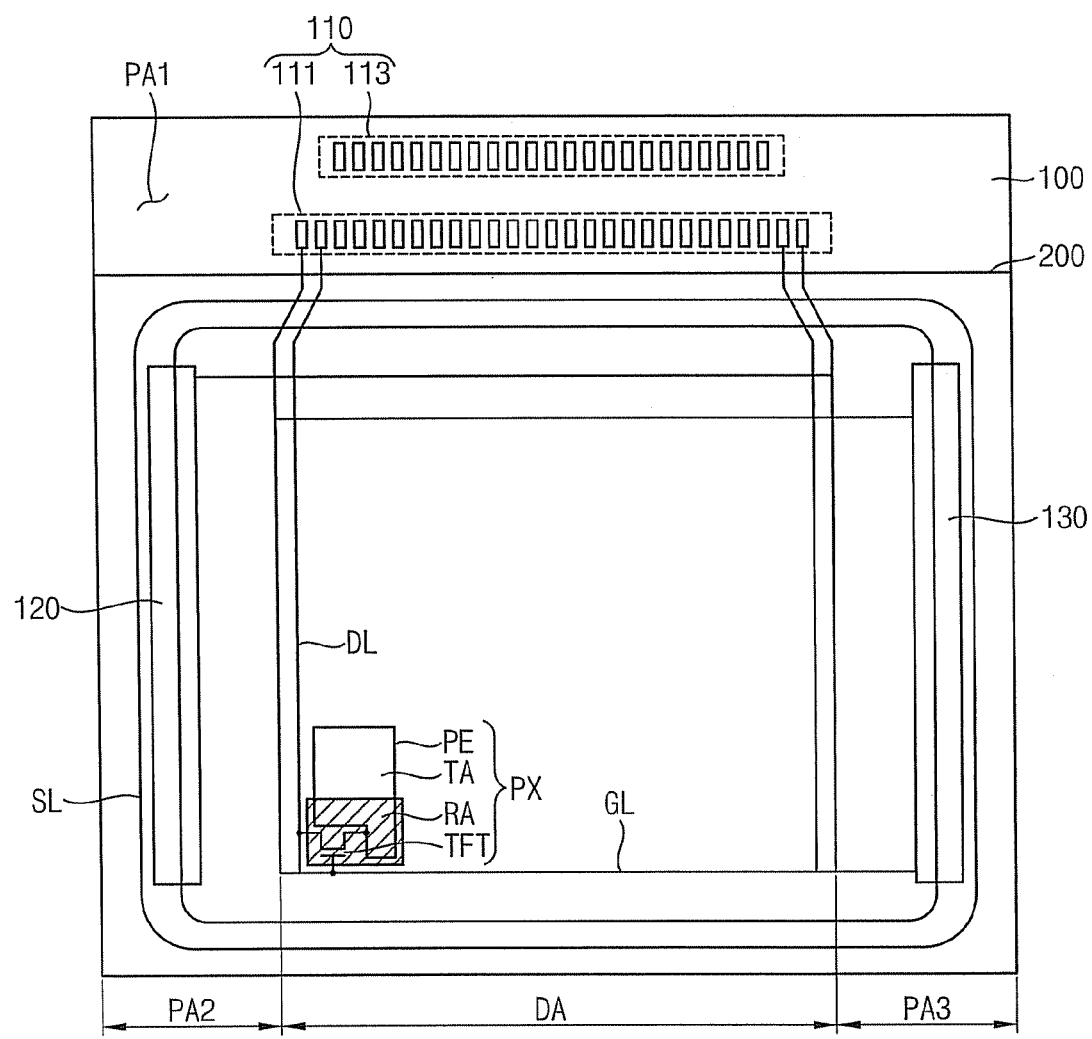
FIG. 4 is a plan view illustrating a transflective liquid crystal display (LCD) panel including an overcoating layer formed by using a photoresist resin composition according to an exemplary embodiment of the present invention.

FIG. 4 is a plan view illustrating a transflective LCD panel including an overcoating layer formed using a photoresist resin composition according to an exemplary embodiment of the present invention.

Referring to FIG. 4, a top-down view of the backside of a transflective LCD panel includes a display substrate 100, a color filter substrate 200 superimposed over and coincident with a portion of the display substrate 100 and a liquid crystal layer (not shown) interposed between the display substrate 100 and the color filter substrate 200.

The display substrate 100 includes a display area DA, a first peripheral area PA1, a second peripheral area PA2, and a third peripheral area PA3.

A plurality of source lines DL extend in a first direction (along an X-axis) from the first peripheral area PA1 to the display area DA, and a plurality of gate lines GL extend in a second direction (along a Y-axis) substantially perpendicular to the first direction from the second and third peripheral areas PA2 and PA3, respectively, into display area DA.

A plurality of pixels PX located at the junction of the source lines DL and the gate lines GL are formed in the display area DA. A thin film transistor switching device TFT and a pixel electrode PE electrically connected to the switching device TFT are formed in each of the pixels PX.

The pixel PX includes a reflective area RA having a reflective electrode (foreground, in FIG. 4), and a transmissive area TA not having the reflective electrode, which is at least partially covered by the reflective area RA in FIG. 4. The transmissive area TA transmits a first light beam (hereinafter referred to an internally provided light beam) incident into the transmissive area TA from a rear surface of the transflective LCD panel (facing view in FIG. 4). A second light beam (hereinafter referred to an externally provided light beam) incident to the reflective area RA from a front surface (not shown) of the transflective LCD panel is reflected from the reflective area RA.

A pad part 110 that applies a driving signal to the transflective LCD panel is formed in the first peripheral area PA1. The pad part 110 includes a first pad part 111, to which the driving signal is applied from a flexible printed circuit board (not shown), and a second pad part 113 that applies a data voltage to the source lines DL based on the driving signal.

Gate circuit parts 120 and 130 for outputting the gate signal to the gate lines GL may be formed in one or both of the second peripheral area PA2 and the third peripheral area PA3.

A first gate circuit part 120 outputting a gate signal to the odd-numbered gate lines GLa is formed in the second peripheral area PA2.

A second gate circuit part 130 outputting a gate signal to the even-numbered gate lines of the gate lines GLb is formed in the third peripheral area PA3.

A seal line area SL is formed in a peripheral area including the first, second and third peripheral areas PA1, PA2, and PA3, respectively, that surround the display area DA. A seal member coupling the display substrate 100 to the color filter substrate 200 is formed in the seal line area SL.

A plurality of color filter patterns corresponding to the pixels PX and a common electrode corresponding to the pixel electrode PE are formed on the color filter substrate 200. The color filter patterns include, for example, a red color filter pattern, a green color filter pattern and a blue color filter pattern. The common electrode (i.e., pixel electrode PE) serves as an electrode of a liquid crystal capacitor (not shown) in the pixel PX of the transflective LCD panel. A common voltage ("VCOM") is applied to the common electrode (i.e., pixel electrode PE).

The seal member is formed in the seal line area SL to couple the display substrate 100 to the color filter substrate 200. Therefore, liquid crystals are injected into a space between the display substrate 100 and the color filter substrate 200 in the second direction of the Y-axis.

An overcoating layer corresponding to the reflective area RA is formed on the display substrate 100 or the color filter substrate 200 so that the liquid crystal layer (not shown) in the reflective area RA has substantially the same cell gap as a cell gap of the liquid crystal layer (not shown) in the transmissive area TA.

Figure 5:
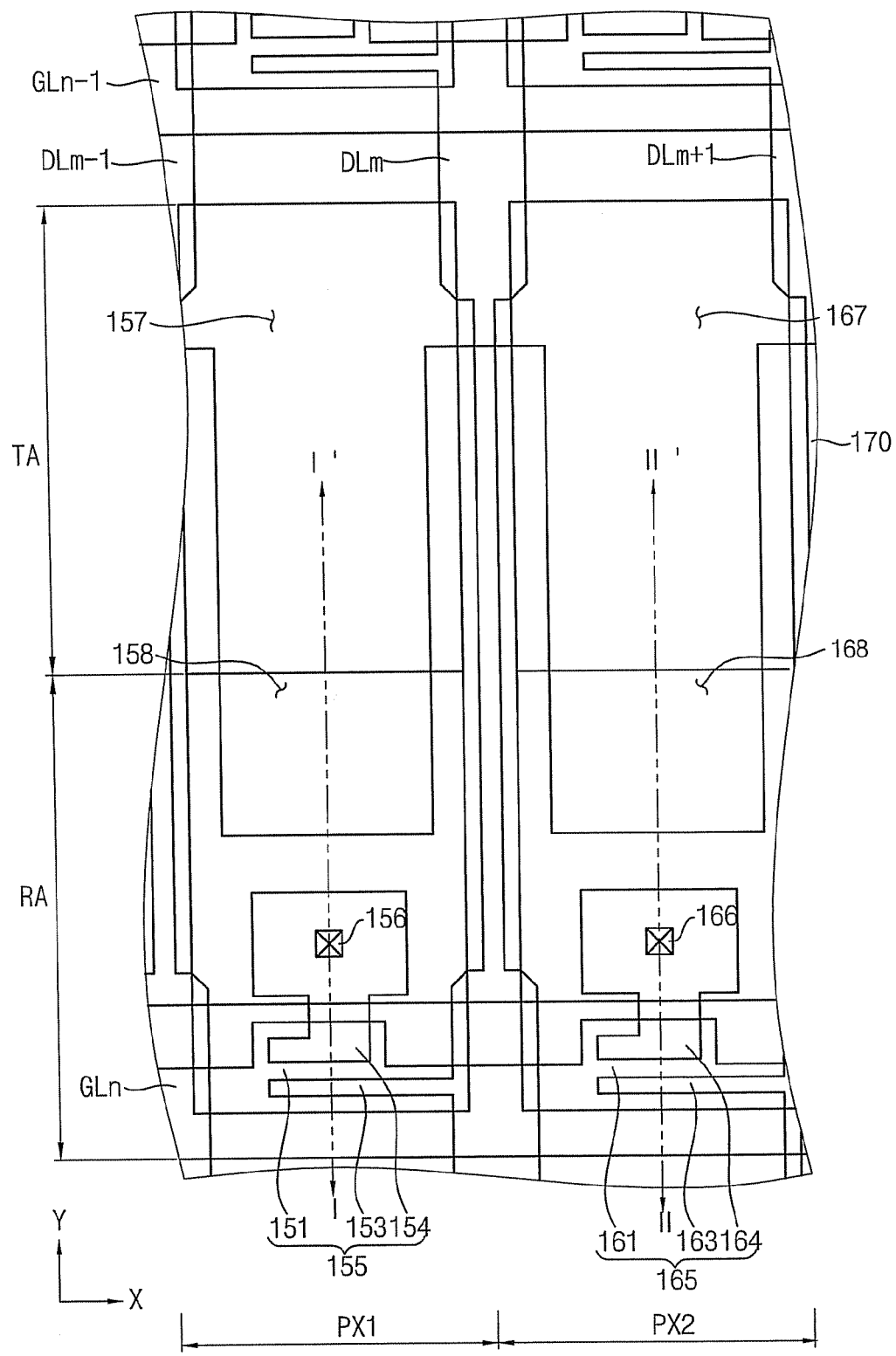
FIG. 5 is another plan view illustrating the LCD panel illustrated in FIG. 4.
Figure 6:
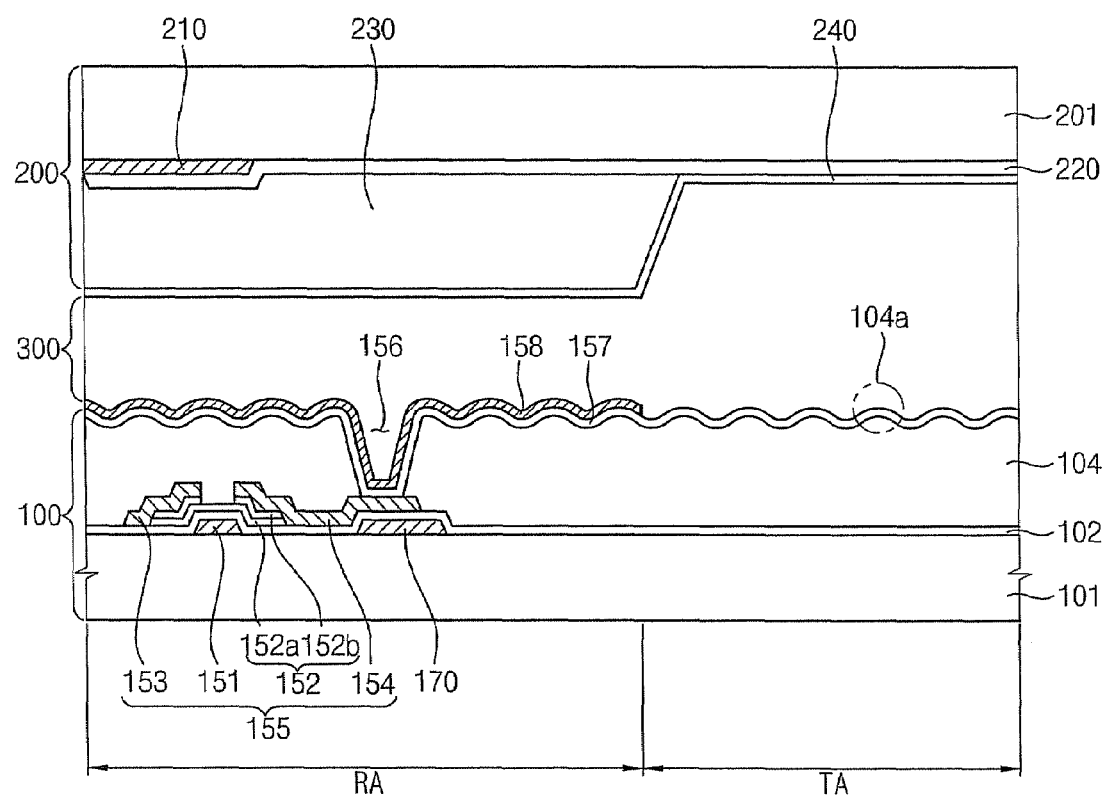
FIG. 6 is a cross-sectional view taken along a line I-I' in FIG. 5.

FIG. 5 is a close up plan view illustrating pixels of the LCD panel illustrated in FIG. 4. FIG. 6 is a cross-sectional view taken along a line I-I' in FIG. 5.

Referring to FIG. 5, the LCD panel includes a first pixel PX1 and a second pixel PX2. The first and the second pixels PX1 and PX2 are adjacent to each other.

The first pixel PX1 is defined by the source lines DLm+1 and DLm adjacent to each other and the gate lines GLn−1 and GLn adjacent to each other.

The first pixel PX1 includes a first switching device 155 formed on the display substrate (not shown) and a first pixel electrode 157 electrically connected to the first switching device 155. A first reflective electrode 158 is formed on the first pixel electrode 157. The first reflective electrode 158 defines a transmissive area TA and a reflective area RA in the first pixel PX1.

The first pixel PX1 includes a first color filter pattern (not shown) formed on the color filter substrate (not shown). The first pixel PX1 displays an image by displaying a predetermined color using the first color filter pattern.

The second pixel PX2 is defined by the source lines DLm+1 and DLm adjacent to each other and the gate lines GLn−1 and GLn adjacent to each other.

The second pixel PX2 includes a second switching device 165 formed on the display substrate (not shown) and a second pixel electrode 167 electrically connected to the second switching device 165. A second reflective electrode 168 is formed on the second pixel electrode 167. The second reflective electrode 168 defines a transmissive area TA and a reflective area RA of the second pixel PX2.

The second pixel PX2 includes a second color filter pattern (not shown) formed on the color filter substrate (not shown). The second pixel PX2 displays an image by displaying a predetermined color using the second color filter pattern.

A storage common line 170 is formed in the first pixel PX1 and the second pixel PX2. The storage common line 170 is overlapped with the source lines DLm−1, DLm, and DLm+1.

As illustrated in FIG. 6, the display substrate 100 of the transflective LCD panel includes a first base substrate 101.

A gate pattern is formed on the first base substrate 101. The gate pattern includes gate electrodes 151 and 161 of switching devices 155 and 165, the storage common line 170 and the gate lines (not shown in FIG. 6). The storage common line 170 may be formed to overlap with the source lines (not shown in FIG. 6). Thus, a light-blocking pattern that is formed on the color filter substrate 200 and which corresponds to the source lines (not shown in FIG. 6) may not be formed.

A gate-insulating layer 102 is formed on the gate pattern. A channel layer 152 is formed by sequentially forming an amorphous silicon layer 152a and an in-situ doped n$^+$ amorphous silicon layer 152b on the gate-insulating layer 102.

A source metal pattern is formed on the channel layer 152. The source metal pattern includes source electrodes 153 and 163, drain electrodes 154 and 164 and the source lines (not shown in FIG. 6).

A first overcoating layer 104 is formed on the source metal pattern to planarize a surface of the display substrate. Alternatively, a passivation layer and the first overcoating layer 104 may be sequentially formed on the source metal pattern.

The first overcoating layer 104 includes contact holes 156 and 166 exposing a portion of the drain electrodes 154 and 164.

The first overcoating layer 104 is formed by coating a photoresist resin composition on the source metal pattern and performing a photolithographic exposing process using a mask having a predetermined pattern corresponding to the contact holes 154 and 164, and developing the contact holes 154 and 156 using a developing process. The photoresist resin composition used to pattern the contact holes includes about 10 to about 40% by weight of an acryl-based copolymer, about 0.5 to about 25% by weight of a quinone diazide compound, about 50 to about 80% by weight of a solvent, and about 0.01 to about 0.5% by weight of a silane-based surfactant, wherein the weights of each of the acryl-based copolymer, quinone diazide compound, solvent, and silane-based surfactant are based on the total weight of acryl-based copolymer, quinone diazide compound, solvent, and silane-based surfactant.

The acryl-based copolymer may be prepared by copolymerizing monomers including about 5 to about 40% by weight of an unsaturated carboxylic acid, about 10 to about 70% by weight of an unsaturated compound containing an epoxy group, and about 10 to about 70% by weight of an unsaturated olefin-based compound, based on the total weight of the monomers. The acryl-based copolymer may have an Mw of about 5,000 to about 30,000.

Examples of the solvent may include a diethylene glycol solvent such as diethylene glycol monomethyl ether, diethylene glycol monoethyl ether, diethylene glycol dimethyl ether, diethylene glycol diethyl ether, diethylene glycol methyl ethyl ether, or a mixture comprising at least one of the foregoing solvents.

The silane-based surfactant is represented by Chemical Formula (1):

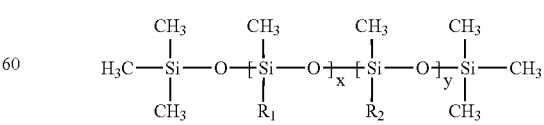

wherein $R_1$ represents an ethylene oxide group, $R_2$ represents a propylene oxide group, and X and Y represent integers of about 1 to about 20.

The photoresist resin composition is advantageous in terms of fluidity and coating stability to form an overcoating layer advantageous for planarizing a surface of a display substrate.

The pixel electrodes 157 and 167 are formed on the first overcoating layer 104. For example, each of the pixel electrodes 157 and 167 may be formed in a whole pixel area or a portion of the pixel area corresponding to a transmissive area. Each of the pixel electrodes 157 and 167 may be a transparent electrode capable of transmitting light and may include indium tin oxide (ITO), indium zinc oxide (IZO), and the like.

The reflective electrodes 158 and 168 are formed on the pixel electrodes 157 and 167. The reflective electrodes 158 and 168 may be metal patterns capable of reflecting light and may include aluminum and/or an aluminum-neodymium alloy.

An undulating (also referred to as "convex-concave") structure 104a may be formed on a surface of the first overcoating layer 104 opposite gate insulating layer 102. The convex-concave structure 104a corresponding to the transmissive area TA serves as a transmissive microlens to scatter an internal light beam. The convex-concave structure 104a corresponding to the reflective area RA may serve as a reflective microlens to scatter an external light beam. Alternatively, the surface of the first overcoating layer 104 may be flat (not shown).

The color filter substrate 200 includes a second base substrate 201.

A light-blocking layer 210 is formed on the second base substrate 201. For example, the light-blocking layer 210 may be formed to overlap with the source lines (not shown in FIG. 6) and the gate lines (not shown in FIG. 6) of the display substrate 100.

In this embodiment, the storage common line 170 is formed under the source lines (not shown in FIG. 6) to overlap with the source lines (not shown in FIG. 6). Thus, the light-blocking layer 210 is formed to overlap with the gate lines (not shown in FIG. 6). Alternatively, the light-blocking layer 210 may be formed to overlap with the source lines (not shown in FIG. 6).

A color filter layer 220 is formed on the second base substrate 201 having the light-blocking layer 210. The color filter layer 220 includes red, green, and blue filter patterns corresponding to each of the pixels.

A second overcoating layer 230 is formed on the color filter layer 220 corresponding to the reflective area RA. Thus, a cell gap (i.e., the light path length) of the transmissive area TA is twice that of the cell gap of the reflective area RA. Therefore, the path of an external light beam reflected at the reflective area RA is substantially the same as a path of an internal light beam transmitted through the transmissive area TA. The second overcoating layer 230 may be formed using substantially the same photoresist resin composition as the photoresist resin composition of the first overcoating layer 104.

A common electrode layer 240 is formed on the second overcoating layer 230.

A method of manufacturing a display substrate according to an exemplary embodiment of the present invention is described more fully hereinafter.

Method of Manufacturing a Display Substrate

FIGS. 7A to 7E are cross-sectional views illustrating a manufacturing process of the display substrate illustrated in FIG. 6.

Figure 7A:
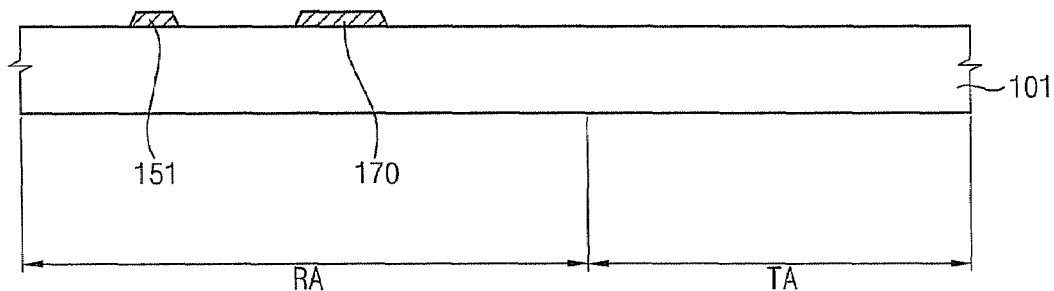
FIGS. 7A to 7E are cross-sectional views illustrating a manufacturing process of the display substrate illustrated in FIG. 6.

Referring to FIGS. 6 and 7A, a metal layer is formed on a first base substrate 101. The metal layer is etched using a metal etch process after forming a photoresist pattern using coating, photolithography, and developing processes so that a gate metal pattern including a gate line GL, a gate electrode 151 and a storage common line 170 is formed.

Examples of a material that may be used for the metal layer may include chromium, aluminum, tantalum, tungsten, copper, silver, and the like, or an alloy comprising at least one of the foregoing metals. The metal layer may be deposited through a sputtering process. The metal layer may include at least two different metal layers, having physical properties different from each other.

Figure 7B:
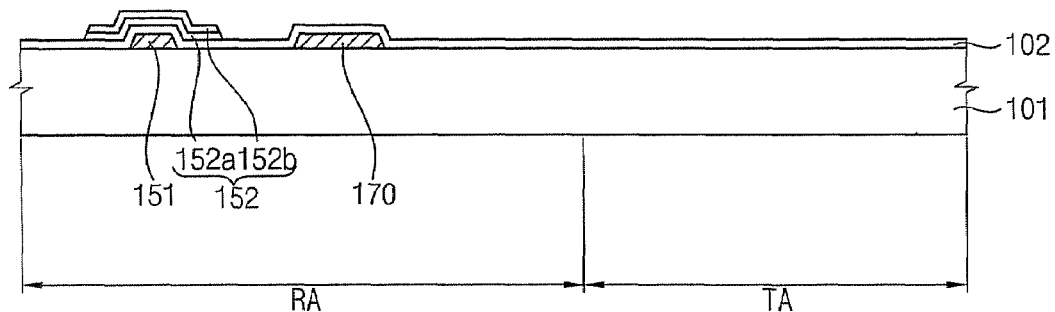

Referring to FIGS. 6 and 7B, a gate insulating layer 102 including a silicon nitride (SiNx) layer, an amorphous silicon layer 152a and an in-situ doped $n^+$ amorphous silicon layer 152b are sequentially formed through a plasma-enhanced chemical vapor deposition ("PECVD") method. The amorphous silicon layer 152a and the in-situ doped $n^+$ amorphous silicon layer 152b are etched through the photolithography process to form a channel layer 152 overlapped with the gate electrode 151.

Figure 7C:
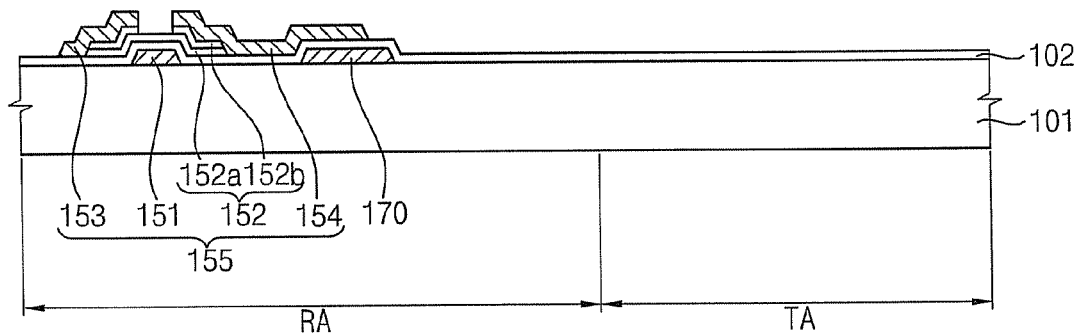

Referring to FIGS. 6 and 7C, a metal layer is formed on the gate-insulating layer 102 having the channel layer 152. Examples of a material that may be used for the metal layer may include chromium, aluminum, tantalum, tungsten, copper, silver, and the like, or an alloy comprising at least one of the foregoing metals. The metal layer may be deposited through a sputtering process. The metal layer may include at least two metal layers having physical properties that are different from each other.

A source metal pattern including a source electrode 153 of a switching device, a drain electrode 154 and a source line DL is formed by etching the metal layer. The source electrode 153 is spaced apart from the drain electrode 154. The drain electrode 154 covers a portion of the storage common line 170.

The amorphous silicon layer 152a is partially exposed by etching the $n^+$ amorphous silicon layer 152b between the source electrode 153 and the drain electrode 154.

Figure 7D:
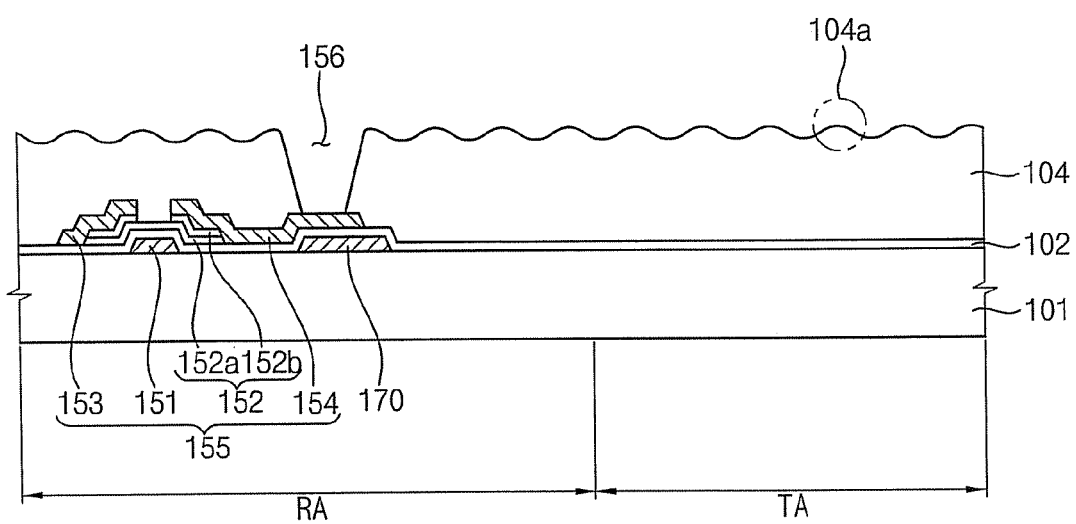

Referring to FIGS. 6 and 7D, a photoresist resin composition is coated on the source metal pattern. The photoresist resin composition includes about 10 to about 35% by weight of an acryl-based copolymer, about 5 to about 10% by weight of a quinone diazide compound, about 55 to about 80% by weight of a diethylene glycol solvent, and about 0.01 to about 0.5% by weight of a silane-based surfactant represented by Chemical Formula (1):

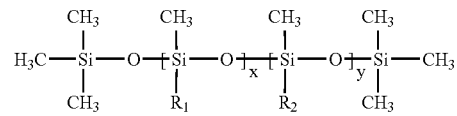

wherein $R_1$ represents an ethylene oxide group, $R_2$ represents a propylene oxide group, and X and Y represent integers of about 1 to about 20, and the weights of each of the acryl-based copolymer, quinone diazide compound, solvent, and silane-based surfactant are based on the total weight of acryl-based copolymer, quinone diazide compound, solvent, and silane-based surfactant.

The acryl-based copolymer may be prepared by copolymerizing monomers including about 5 to about 40% by weight of an unsaturated carboxylic acid, about 10 to about 70% by weight of an unsaturated compound containing an epoxy group, and about 10 to about 70% by weight of an unsaturated olefin-based compound, based on the total weight of the monomers. The acryl-based copolymer has an Mw of about 5,000 to about 30,000.

An example of the solvent includes a diethylene glycol solvent, such as diethylene glycol monomethyl ether, diethylene glycol monoethyl ether, diethylene glycol dimethyl ether, diethylene glycol diethyl ether, diethylene glycol methyl ethyl ether, and the like. These can be used alone or in a mixture comprising at least one of the foregoing solvents.

The photoresist resin composition may further include an additive, such as a melamine resin, an adhesive, an acryl-based compound, and the like. These can be used alone or in a mixture comprising at least one of the foregoing additives.

The content of the additive may be about 2 to about 3% by weight based on the total weight of the photoresist resin composition.

A first overcoating layer 104 having a contact hole 156 is formed by exposing the photoresist resin composition by means of a mask having a predetermined pattern and developing the photoresist resin composition. The contact hole 156 exposes a portion of the drain electrode 154. Since the photoresist resin composition is advantageous in terms of fluidity and coating stability, an overcoating layer advantageous for planarizing a surface of a display substrate 100 may be formed.

For example, a convex-concave structure 104a may be formed on a surface of the first overcoating layer 104.

Furthermore, a passivation layer may be formed under the first overcoating layer.

Figure 7E:
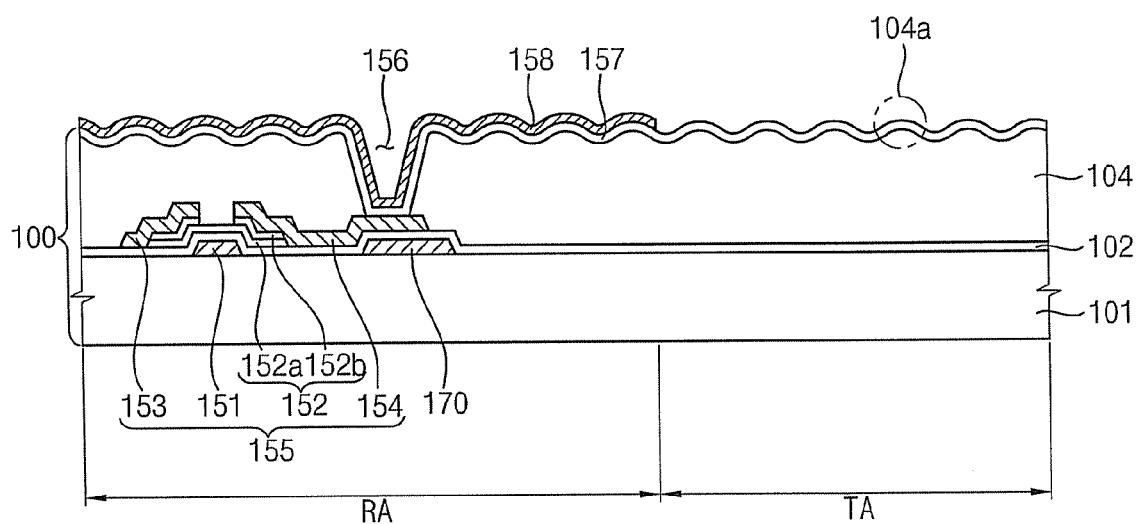

Referring to FIG. 7E, transparent conductive material is deposited on the first overcoating layer 104 having the contact hole 156. Examples of the transparent conductive material may include indium tin oxide (ITO), indium zinc oxide (IZO), and the like. The transparent conductive material deposited on the first overcoating layer 104 is etched through a photolithography process to form a pixel electrode 157. The pixel electrode 157 is electrically connected to the drain electrode 154 through the contact hole 156.

A metal layer is formed on the pixel electrode 157. A portion of the metal layer is removed through the photolithography patterning, development, and etch processes to form a reflective electrode 158 at a portion of the pixel electrode 157. The reflective electrode 158 may reflect light and may include aluminum, an aluminum-neodymium alloy, etc. An area, in which the reflective electrode 158 is formed, corresponds to a reflective area RA. An area, in which the reflective electrode 158 is not formed, corresponds to a transmissive area TA.

A convex-concave structure 104a of the transmissive area TA serves as a transmissive microlens to scatter an internal light beam. A convex-concave structure 104a of the reflective area RA also serves as a reflective microlens to scatter an external light beam. Alternatively, the surface of the first overcoating layer may be flat (not shown).

FIG. 8 is a cross-sectional view illustrating a transflective LCD panel according to another exemplary embodiment of the present invention. Particularly, FIG. 8 is a cross-sectional view taken along the line II-II' of FIG. 5.

Referring to FIGS. 5 and 8, a display substrate 100 of the transflective LCD panel includes a first base substrate 101.

A gate pattern is formed on the first base substrate 101. The gate pattern includes gate electrodes 151 and 161 of switching devices 155 and 165, a storage common line 170, and gate lines GLn−1 and GLn (in FIG. 5; not shown in FIG. 8). The storage common line 170 may overlap with source lines DLm−1, DLm and DLm+1 (in FIG. 5; not shown in FIG. 8). Thus, a light-blocking pattern that is formed on the color filter substrate 200 and corresponds to the source lines DLm−1, DLm, and DLm+1 (in FIG. 5; not shown in FIG. 8) may not be formed.

A gate-insulating layer 102 is formed on the gate pattern. An amorphous silicon layer 162a and an in-situ doped n+ amorphous silicon layer 162b are sequentially formed on the gate insulating layer 102 to form a channel layer 162.

A source metal pattern is formed on the channel layer 162. The source metal pattern includes source electrodes 153 and 163 of the switching devices 155 and 165, drain electrodes 154 and 164, and the source lines DLm−1, DLm, and DLm+1.

A passivation layer 103 and a first overcoating layer 104 are sequentially formed on the source metal pattern.

The first overcoating layer 104 corresponds to a reflective area RA. The first overcoating layer 104 includes contact holes 156 and 166 exposing a portion of the drain electrodes 154 and 164. Thus, a cell gap of a transmissive area TA is twice a cell gap of the reflective area RA. Thus, a path of an external light beam reflected at the reflective area RA is substantially the same as a path of an internal light beam passing through the transmissive area TA.

The first overcoating layer 104 is formed by coating a photoresist resin composition on the source metal pattern and performing an exposing process and a developing process using a mask that has a predetermined pattern. The photoresist resin composition includes about 10 to about 40% by weight of an acryl-based copolymer, about 0.5 to about 25% by weight of a quinone diazide compound, about 50 to about 80% by weight of a solvent, and about 0.01 to about 0.5% by weight of a silane-based surfactant, wherein the weights of each of the acryl-based copolymer, quinone diazide compound, solvent, and silane-based surfactant are based on the total weight of acryl-based copolymer, quinone diazide compound, solvent, and silane-based surfactant.

The acryl-based copolymer may be prepared by copolymerizing monomers including about 5 to about 40% by weight of an unsaturated carboxylic acid, about 10 to about 70% by weight of an unsaturated compound containing an epoxy group, and about 10 to about 70% by weight of an unsaturated olefin-based compound based on the total weight of the monomers. The acryl-based copolymer may have an Mw of about 5,000 to about 30,000.

Examples of the solvent may include a diethylene glycol solvent such as diethylene glycol monomethyl ether, diethylene glycol monoethyl ether, diethylene glycol dimethyl ether, diethylene glycol diethyl ether, diethylene glycol methyl ethyl ether, or a mixture comprising at least one of the foregoing monomers.

The silane-based surfactant is represented by Chemical Formula (1):

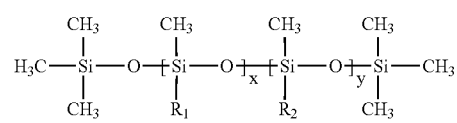

wherein $R_1$ represents an ethylene oxide group, $R_2$ represents a propylene oxide group, and X and Y represent integers of about 1 to about 20.

The photoresist resin composition is advantageous in terms of fluidity and coating stability to form an overcoating layer advantageous for planarizing a surface of a display substrate.

Pixel electrodes 157 and 167 are formed on the first overcoating layer 104. For example, each of the pixel electrodes 157 and 167 may be formed in a whole pixel area or a portion of the pixel area corresponding to the transmissive area TA. Each of the pixel electrodes 157 and 167 may include a transparent parent material capable of transmitting light, such as indium tin oxide (ITO), indium zinc oxide (IZO), and the like.

Reflective electrodes 158 and 168 are formed on the pixel electrodes 157 and 167. The reflective electrodes 158 and 168 may be metal patterns capable of reflecting light and may include aluminum, an aluminum-neodymium alloy, and the like.

A convex-concave structure 104a may be formed on a surface of the first overcoating layer 104. The convex-concave structure 104a corresponding to the transmissive area TA serves as a transmissive microlens to scatter an internal light beam. The convex-concave structure 104a corresponding to the reflective area RA serves as a reflective microlens to scatter an external light beam. Alternatively, the surface of the first overcoating layer 104 may be flat (not shown).

The color filter substrate 200 includes a second base substrate 201.

A light-blocking layer 210 is formed on the second base substrate 201. For example, the light-blocking layer 210 may overlap with the source lines DLm−1, DLm, and DLm+1 (in FIG. 5; not shown in FIG. 8) and the gate lines GLn−1 and GLn (in FIG. 5; not shown in FIG. 8) of the display substrate 100.

In this embodiment, the storage common line 170 is formed under the source lines DLm−1, DLm, and DLm+1 (in FIG. 5; not shown in FIG. 8) to overlap with the source lines DLm−1, DLm, and DLm+1 (in FIG. 5; not shown in FIG. 8). Thus, the light-blocking layer 210 may be formed in an area corresponding to the gate lines GLn−1 and GLn (in FIG. 5; not shown in FIG. 8).

A color filter layer 220 is formed on the second base substrate 201 having the light-blocking layer 210. The color filter layer 220 includes a first color filter pattern formed in a first pixel PX1, and a second color filter pattern formed in a second pixel PX2. For example, the color filter layer 220 may include a red filter pattern, a green filter pattern, and a blue filter pattern.

A second overcoating layer 230 and a common electrode layer 240 are sequentially formed on the color filter layer 220. The second overcoating layer 230 may be formed using a photoresist resin composition substantially the same as the photoresist resin composition of the first overcoating layer 104.

The present invention will hereinafter be further described through Examples and Comparative Examples.

Preparation of Acryl-Based Copolymer

SYNTHETIC EXAMPLE 1

About 10 parts by weight of 2,2'-azobis(2,4-dimethyl valeronitrile), about 300 parts by weight of diethylene glycol dimethyl ether, about 20 parts by weight of methacrylic acid, about 10 parts by weight of glycidyl methacrylic acid, about 25 parts by weight of 2-hydroxyethyl acrylate, about 30 parts by weight of isobornyl acrylate, and about 15 parts by weight of cyclohexyl methacrylate, based on the total weight of the foregoing components, were added into a flask provided with a cooling tube and a stirrer. Then, the atmosphere in the flask was replaced with nitrogen and the reactants were stirred. The reacting solution was heated to about 62° C. and this temperature was kept for about 5 hours to prepare a polymer solution including the copolymer. The solids content of the polymer solution was about 25% by weight based on the total weight of the polymer solution. The weight-averaged molecular weight (Mw) of the copolymer, as determined using Gel Permeation Chromatography (GPC), was about 10,000.

Preparation of Quinone Diazide Compound

SYNTHETIC EXAMPLE 2

4,4'-[1-[4-[1-[4-hydroxyphenyl]-1-methylethyl]phenyl] ethylidene]bisphenol-1,2-naphthoquinonediazide-5-sulfonic acid ester was prepared by condensing about 1 mol of 4,4'-[1-[4-[1-[4-hydroxyphenyl]-1-methylethyl]phenyl]ethylidene]bisphenol, and about 2 mol of 1,2-naphthoquinone diazide-5-sulfonic acid chloride in the presence of about 2 mol of triethylamine (base) and liters of acetone (solvent). Condensation was carried out at room temperature, and the reaction was stirred for approximately 12 hours. The reaction was filtered through filter aid (celite) to remove triethylammonium chloride salt as a by-product, and the crude quinone diazide was precipitated by diluting the acetone solution with water (1:10 volume ratio of acetone solution in water). The quinone diazide was collected on a funnel, washed with water, and dried in vacuo at room temperature for 24 hours to constant weight.

Preparation of Photoresist Resin Composition

EXAMPLE 1

About 100 parts by weight of a polymer solution prepared by Synthetic Example 1, and about 8 parts by weight of 4,4'-[1-[4-[1-[4-hydroxyphenyl]-1-methylethyl]phenyl]ethylidene]bisphenol 1,2-naphthoquinone diazide-5-sulfonic acid ester were combined and dissolved in diethylene glycol dimethyl ether to obtain a solids content of the thus-obtained polymer-quinone diazide compound solution of about 27% by weight of total solids. About 0.15% by weight of a surfactant based on solids and as represented by Chemical Formula (2a) was added to the solution:

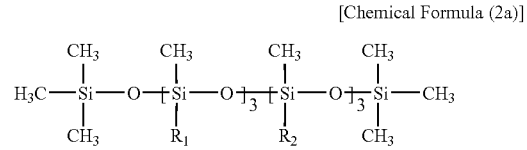

[Chemical Formula (2a)]

wherein $R_1$ represents an ethylene oxide group, and $R_2$ represents a propylene oxide group. The thus-obtained solution was filtered using a Millipore filter having a pore size of about 0.2 μm to obtain a photoresist resin composition.

EXAMPLE 2

About 100 parts by weight of a polymer solution prepared by Synthetic Example 1, and about 8 parts by weight of 4,4'-[1-[4-[1-[4-hydroxyphenyl]-1-methylethyl]phenyl]ethylidene]bisphenol 1,2-naphthoquinone diazide-5-sulfonic acid ester were combined and dissolved in diethylene glycol methyl ethyl ether to obtain a solids content of the polymer and quinone diazide compound solution of about 27% by weight. About 0.15% by weight based on solids of a surfactant of Chemical Formula (2a) was added to the solution. The thus-obtained solution was filtered using a Millipore filter having a pore size of about 0.2 μm to obtain a photoresist resin composition.

EXAMPLE 3

About 100 parts by weight of a polymer solution prepared by Synthetic Example 1, and about 8 parts by weight of 4,4'-[1-[4-[1-[4-hydroxyphenyl]-1-methylethyl]phenyl]ethylidene]bisphenol 1,2-naphthoquinone diazide-5-sulfonic acid ester were combined and dissolved in diethylene glycol diethyl ether to obtain a solids content of the thus-obtained polymer-quinone diazide compound solution of about 27% by weight of total solids. About 0.15% by weight of a surfactant of Chemical Formula (2a) was added to the polymer solution. The thus-obtained polymer solution was filtered using a Millipore filter having a pore size of about 0.2 μm to obtain a photoresist resin composition.

EXAMPLE 4

About 100 parts by weight of a polymer solution prepared by Synthetic Example 1, and about 8 parts by weight of 4,4'-[1-[4-[1-[4-hydroxyphenyl]-1-methylethyl]phenyl]ethylidene]bisphenol 1,2-naphthoquinone diazide-5-sulfonic acid ester were combined and dissolved in diethylene glycol dimethyl ether to obtain a solids content of the thus-obtained polymer-quinone diazide compound solution of about 27% by weight of total solids. About 0.15% by weight of a surfactant of Chemical Formula (2b) was added to the solution:

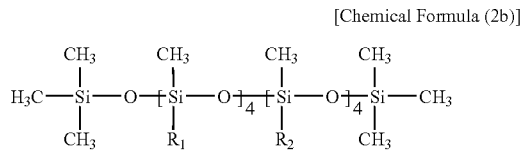

[Chemical Formula (2b)]

wherein $R_1$ represents an ethylene oxide group, and $R_2$ represents a propylene oxide group. The thus-obtained solution was filtered using a Millipore filter having a pore size of about 0.2 μm to obtain a photoresist resin composition.

EXAMPLE 5

About 100 parts by weight of a polymer solution prepared by Synthetic Example 1, and about 8 parts by weight of 4,4'-[1-[4-[1-[4-hydroxyphenyl]-1-methylethyl]phenyl]ethylidene]bisphenol 1,2-naphthoquinone diazide-5-sulfonic acid ester were combined and dissolved in diethylene glycol diethyl ether to obtain a solids content of the thus-obtained polymer-quinone diazide compound solution of about 27% by weight. About 0.15% by weight of a surfactant of Chemical Formula (2c) was added to the solution:

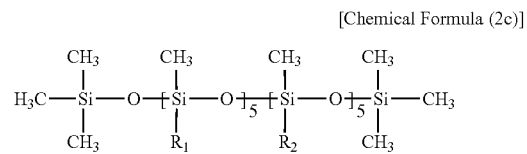

[Chemical Formula (2c)]

wherein $R_1$ represents an ethylene oxide group, and $R_2$ represents a propylene oxide group. The thus-obtained solution was filtered using a Millipore filter having a pore size of about 0.2 μm to obtain a photoresist resin composition.

COMPARATIVE EXAMPLE 1

About 100 parts by weight of a polymer solution prepared by Synthetic Example 1, and 8 parts by weight of 4,4'-[1-[4-[1-[4-hydroxyphenyl]-1-methylethyl]phenyl]ethylidene]bisphenol 1,2-naphthoquinone diazide-5-sulfonic acid ester were combined and dissolved in propylene glycol methyl ether acetate to obtain a solids content of the thus-obtained polymer-quinone diazide compound solution of about 27% by weight. About 0.15% by weight of polyoxyethylene octylphenyl ether as a surfactant was added to the solution. The thus-obtained solution was filtered using a Millipore filter having a pore size of about 0.2 μm to obtain a photoresist resin composition.

EXPERIMENT 1

Evaluation of Fluidity of Photoresist Resin Composition

Evaluation of fluidity of each photoresist resin composition prepared according to Examples 1 to 5 and Comparative Example 1 were conducted as follows. A drop of each of the photoresist resin compositions was evaluated by dropping on a substrate by using the Sessile prop Method of the prop Shape Analysis System DSA-100 (manufactured by KRUSS GmbH, Germany), and the contact angle for each of the photoresist resin compositions was measured on a substrate. A silicon nitride (SiNx) substrate was used as the substrate. The results obtained are illustrated in Table 1.

Referring to Table 1, it can be seen that each of the photoresist resin compositions prepared by the Examples 1 to 5 has a greater degree of fluidity (i.e., a lower contact angle) than the fluidity of the photoresist resin composition prepared by the Comparative Example 1.

TABLE 1

| | Evaluation of Fluidity (contact angle on the substrate) |
|---|---|
| Example 1 | At most 10 degrees |
| Example 2 | At most 10 degrees |
| Example 3 | At most 10 degrees |
| Example 4 | At most 10 degrees |
| Example 5 | At most 10 degrees |
| Comparative Example 1 | At least 30 degrees |

EXPERIMENT 2

Evaluation of Coating Stability of Photoresist Resin Composition

Evaluations of coating stabilities of the photoresist resin compositions prepared by the Examples 1 to 5 and Comparative Example 1 were conducted as follows. Each of the photoresist resin compositions was coated on a substrate by using a spin coater operating at the spin speed (measured in revolutions per minute, RPM) values illustrated in Table 2. Thereafter, photoresist resin compositions were pre-baked (i.e., soft baked) on a hot plate at a temperature of about 80 to about 95° C. for about 2 minutes to form photoresist layers. A thickness variation of each of the photoresist layers according to a temperature variation of the pre-baking was measured by using a NanoSpec® metrology tool.

The results so obtained are illustrated in Table 2. In Table 2, "A" represents a thickness variation for each of the photoresist layers of at most about 250 at about 5° C. of temperature variation during pre-baking. "B" represents a thickness variation of each of the photoresist layers of at least about 500 at about 5° C. of temperature variation during pre-baking.

TABLE 2

|  | Coating RPM | Coating Stability |
| --- | --- | --- |
| Example 1 | 1,000 | A |
| Example 2 | 1,050 | A |
| Example 3 | 1,050 | A |
| Example 4 | 1,000 | A |
| Example 5 | 1,020 | A |
| Comparative Example 1 | 1,300 | B |

Referring to Table 2, it can be seen that each of the photoresist resin compositions prepared according to Examples 1 to 5 has a greater coating stability than the coating stability of the photoresist resin composition prepared according to Comparative Example 1.

EXPERIMENT 3

Evaluation of Sensitivity of the Photoresist Pattern

Evaluations of the sensitivities of the photoresist patterns formed using each of the photoresist resin compositions prepared by the Examples 1 to 5 and Comparative Example 1 were conducted as follows.

After each of the photoresist resin compositions was coated on a substrate according to each of the spin speeds (in RPM) given in Table 3, the substrates coated with the photoresist resin compositions were each pre-baked on a hot plate at a temperature of about 90° C. for about 2 minutes to form photoresist layers having a thickness of about 3.0 μm. The photoresist layers were exposed to ultraviolet radiation at a wavelength of about 365 nm and at an intensity of about 15 mW/cm² for about 15 to about 25 seconds. Thereafter, the photoresist layers were developed for about 2 minutes using an aqueous solution of about 0.4% by weight of tetramethyl ammonium hydroxide, at a temperature of about 25° C. Thereafter, the photoresist layers were rinsed with pure, deionized water to form photoresist patterns.

Thereafter, the photoresist layers were exposed to ultraviolet radiation, of which an intensity was about 15 mW/cm² at a wavelength of about 365 nm, for about 34 seconds. Thereafter, the photoresist layers were mid-baked (sometimes referred to as "hard baked") on a hot plate at a temperature of about 130° C. for about 3 minutes. The photoresist layers were then cured in an oven at a temperature of about 220° C. for about 60 minutes.

The results so obtained are illustrated in Table 3. Referring to Table 3, it can be noted that each of the photoresist patterns formed using the photoresist resin compositions prepared by the Examples 1 to 5 has a sensitivity greater than the sensitivity of a photoresist pattern formed using the photoresist resin composition prepared according to Comparative Example 1.

TABLE 3

|  | Costing RPM | Sensitivity (mW/cm²) |
| --- | --- | --- |
| Example 1 | 1,000 | 270 |
| Example 2 | 1,050 | 260 |
| Example 3 | 1,050 | 270 |
| Example 4 | 1,000 | 260 |
| Example 5 | 1,020 | 270 |
| Comparative Example 1 | 1,300 | 280 |

EXPERIMENT 4

Evaluation of the Resolution of a Photoresist Pattern

Evaluations of resolutions of photoresist patterns formed using the photoresist resin compositions prepared by the Examples 1 to 5 and Comparative Example 1 were conducted as follows.

After each of the photoresist resin compositions was coated on a substrate according to the spin speeds (in RPM) given in Table 4, the photoresist resin compositions were pre-baked on a hot plate at a temperature of about 90° C. for about 2 minutes to form photoresist layers having a thickness of about 3.0 μm. The photoresist layers were exposed to ultraviolet radiation at a wavelength of about 365 nm, and having an intensity of about 15 mW/cm², for about 15 to about 25 seconds. Thereafter, each of the photoresist layers was developed for about 2 minutes using an aqueous solution of about 25° C. including about 0.4% by weight of tetramethyl ammonium hydroxide. The photoresist layers were rinsed using pure, deionized water to form photoresist patterns.

Thereafter, the photoresist patterns were exposed to ultraviolet radiation at a wavelength of 365 nm, at an intensity of about 15 mW/cm², for about 34 seconds. Thereafter, the photoresist layers were mid-baked at a temperature of about 130° C. for about 3 minutes. Thereafter, the photoresist patterns were cured in an oven at a temperature of about 220° C. for about 60 minutes. Minimum sizes (i.e., minimum resolved features) for each of the photoresist patterns formed were measured. The thus-obtained results are illustrated in the following Table 4.

Referring to Table 4, it can be noted that the photoresist patterns formed using the photoresist resin compositions prepared according to Examples 1 to 5 and the Comparative Example 1 each have a resolution substantially the same as the other.

TABLE 4

|  | Coating RPM | Resolution (μm) |
| --- | --- | --- |
| Example 1 | 1,000 | 3 |
| Example 2 | 1,050 | 3 |
| Example 3 | 1,050 | 3 |
| Example 4 | 1,000 | 3 |
| Example 5 | 1,020 | 3 |
| Comparative Example 1 | 1,300 | 3 |

EXPERIMENT 5

Evaluation of Heat-Resistance of the Photoresist Pattern

Evaluations of heat resistances of photoresist patterns formed using the photoresist resin compositions prepared according to Examples 1 to 5 and Comparative Example 1 were conducted as follows.

The rate of deformation of the photoresist patterns formed for the evaluation of resolution of photoresist patterns in Experiment 4 were estimated by measuring the angles of edges of the photoresist patterns before and after the mid-baking process. The rate of deformation rates varied by at most about 20% relative to the lowest rate of deformation obtained and were therefore substantially the same as the examples and comparative examples.

EXPERIMENT 6

Evaluation of Transmittance of Photoresist Pattern

Evaluations of transmittances of photoresist patterns formed by using the photoresist resin compositions prepared by the Examples 1 to 5 and Comparative Example 1 were conducted as follows.

Photoresist patterns were formed by substantially the same method as the photoresist patterns formed for evaluating resolution of photoresist patterns. The photoresist patterns were exposed to ultraviolet radiation at a wavelength of 365 nm, at an intensity of about 15 mW/cm$^2$, for about 34 seconds. Thereafter, the photoresist patterns were mid-baked at a temperature of about 130° C. for about 3 minutes. Transmittances of the photoresist patterns were measured after exposure to radiation at a wavelength of about 400 nm and at the same intensity using a spectrophotometer. The transmittance of each of the photoresist patterns were about 90% and were therefore substantially the same as each other.

EXPERIMENT 7

Evaluation of Heat Discoloration Resistance of Transmittance of Photoresist Pattern Evaluation of heat discoloration resistance for photoresist patterns formed using the photoresist resin compositions prepared according to the Examples 1 to 5 and Comparative Example 1 were conducted as follows.

The rate of change in transmittance for the photoresist patterns formed in the evaluation of transmittance of photoresist patterns in Experiment 6 were measured before and after heating the photoresist patterns in an oven at a temperature of about 220° C. for about 1 hour. The rate of change of transmittance for each photoresist pattern varied by at most about 5% and were therefore substantially the same as each other.

Referring to Experiments 1 to 7, it can be noted that each of the photoresist patterns of Examples 1 to 5 has a fluidity and/or a coating stability greater than those of the photoresist pattern for Comparative Example 1. Thus, a photoresist layer having an improved flatness may be formed using the photoresist resin composition according to embodiments of the invention.

Furthermore, referring to Experiments 1 to 7, the photoresist pattern using photoresist resin composition according to embodiments of the invention is advantageous in terms of sensitivity, resolution, heat resistance, transmittance and heat discoloration resistance. Thus, the photoresist pattern formed using the photoresist resin composition disclosed herein is advantageous for patterning.

As described above, the photoresist resin composition of the invention improves the flatness of a surface of an overcoating layer. Thus, the non-uniformity of the overcoating layer due to a height difference between a switching device and lines on an underlying display substrate is improved and can prevent and/or reduce defects having a slant line-shape. Furthermore, a photoresist pattern using the photoresist resin composition is advantageous in terms of sensitivity, resolution, heat resistance, transmittance and heat discoloration resistance. Thus, the photoresist pattern formed using the photoresist resin composition is advantageous for patterning.

Although the exemplary embodiments of the present invention have been described, it is understood that the present invention should not be limited to these exemplary embodiments but various changes and modifications can be made by one ordinary skilled in the art within the spirit and scope of the present invention as claimed hereinafter.

What is claimed is:

1. A photoresist resin composition comprising:
   (A) about 10 to about 35% by weight of an acryl-based copolymer comprising as monomers about 5 to about 40% by weight of an unsaturated carboxylic acid, about 10 to about 70% by weight of an unsaturated compound containing an epoxy group, and about 10 to about 70% by weight of an unsaturated olefin-based compound, based on the total weight of the monomers,
   (B) about 5 to about 10% by weight of a quinone diazide compound,
   (C) about 55 to about 80% by weight of a solvent; and
   (D) about 0.01 to about 0.5% by weight of a silane-based surfactant represented by Chemical Formula (1):

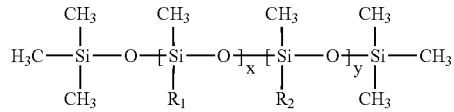

wherein R$_1$ represents an ethylene oxide group, R$_2$ represents a propylene oxide group, and X and Y represent integers of about 1 to about 20, and wherein the weights of each of the acryl-based copolymer, quinone diazide compound, solvent, and silane-based surfactant are based on the total weight of acryl-based copolymer, quinone diazide compound, solvent, and silane-based surfactant.

2. The photoresist resin composition of claim 1, wherein the unsaturated carboxylic acid comprises acrylic acid, methacrylic acid, maleic acid, fumaric acid, citraconic acid, mesaconic acid, itaconic acid, or a mixture comprising at least one of the foregoing unsaturated carboxylic acids.

3. The photoresist resin composition of claim 1, wherein the unsaturated compound containing an epoxy group comprises glycidyl acrylate, glycidyl methacrylate, α-ethylglycidyl acrylate, α-n-propylglycidyl acrylate, α-n-butylglycidyl acrylate, β-methylglycidyl acrylate, β-methylglycidyl methacrylate, β-ethylglycidyl acrylate, β-ethylglycidyl methacrylate, 3,4-epoxybutyl acrylate, 3,4-epoxybutyl methacrylate, 6,7-epoxyheptyl acrylate, 6,7-epoxyheptyl methacrylate, α-ethyl-6,7-epoxyheptyl acrylate, o-vinylbenzyl glycidyl ether, m-vinylbenzyl glycidyl ether, p-vinylbenzyl glycidyl ether, or a mixture comprising at least one of the foregoing unsaturated compounds containing an epoxy group.

4. The photoresist resin composition of claim 1, wherein the unsaturated olefin-based compound comprises methyl methacrylate, ethyl methacrylate, n-butyl methacrylate, sec-butyl methacrylate, tert-butyl methacrylate, methyl acrylate, isopropyl acrylate, cyclohexyl methacrylate, 2-methyl cyclohexyl methacrylate, dicyclopentanyl oxyethyl methacrylate, isobornyl methacrylate, cyclohexyl acrylate, 2-methyl cyclohexyl acrylate, dicyclopentenyl acrylate, dicyclopentanyl acrylate, dicyclopentenyl methacrylate, dicyclopentanyl methacrylate, dicyclopentanyl oxyethyl acrylate, isobornyl acrylate, phenyl methacrylate, phenyl acrylate, benzyl acrylate, benzyl methacrylate, 2-hydroxyethyl methacrylate, styrene, α-methyl styrene, m-methyl styrene, p-methyl styrene, vinyl toluene, 1,3-butadiene, isoprene, 2,3-dimethyl-1,3-butadiene, or a mixture comprising at least one of the foregoing unsaturated olefin-based compounds.

5. The photoresist resin composition of claim 1, wherein the quinone diazide compound comprises at least one selected from the group consisting of 1,2-quinone diazide-4-sulfonic acid ester, 1,2-quinone diazide-5-sulfonic acid ester, 1,2-quinone diazide-6-sulfonic acid ester, or a mixture comprising at least one of the foregoing quinone diazide compounds.

6. The photoresist resin composition of claim 1, wherein the solvent comprises diethylene glycol monomethyl ether, diethylene glycol monoethyl ether, diethylene glycol dimethyl ether, diethylene glycol diethyl ether, diethylene glycol methyl ethyl ether, or a mixture comprising at least one of the foregoing solvents.

7. The photoresist resin composition of claim 1, wherein the acryl-based copolymer has a weight-average molecular weight of about 5,000 to about 30,000.

8. The photoresist resin composition of claim 1, further comprising at least one additive comprising a melamine resin, an adhesive, an acryl-based compound, or a mixture comprising at least one of the foregoing additives.

9. The photoresist resin composition of claim 8, wherein the additive is present in an amount of about 2 to about 3% by weight based on the total weight of the photoresist resin composition.

10. The photoresist resin composition of claim 9, wherein the melamine resin is present in an amount of about 20 to about 30% by weight, the adhesive is present in an amount of about 45 to about 55% by weight, or the acryl-based copolymer is present in an amount of about 25 to about 30% by weight, wherein each of the melamine resin, the adhesive, or the acryl-based copolymer is based on the total weight of additive.

11. A method of forming a photoresist pattern, the method comprising: coating a photoresist resin composition on a surface of a substrate to form a photoresist layer, wherein the photoresist resin composition comprises about 10 to about 35% by weight of an acryl-based copolymer, about 5 to about 10% by weight of a quinone diazide compound, about 55 to about 80% by weight of a solvent, and about 0.01 to about 0.5% by weight of a silane-based surfactant represented by Chemical Formula (1):

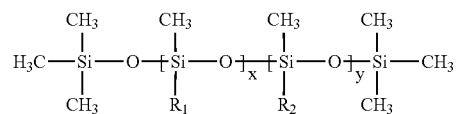

wherein $R_1$ represents an ethylene oxide group, $R_2$ represents a propylene oxide group, and X and Y represent integers of about 1 to about 20, and wherein the weights of each of the acryl-based copolymer, quinone diazide compound, solvent, and silane-based surfactant are based on the total weight of acryl-based copolymer, quinone diazide compound, solvent, and silane-based surfactant; and patterning the photoresist layer to form a photoresist pattern.

12. The method of claim 11, wherein patterning the photoresist layer comprises:

selectively exposing the photoresist layer to light; and developing the exposed photoresist layer.

13. The method of claim 12, further comprising curing the photoresist layer after developing.

14. The method of claim 13, wherein the curing of the developed photoresist layer is performed at a temperature of 150 to 200° C.

15. The method of claim 12, wherein the selective exposing of the photoresist layer is performed using at least one selected from the group consisting of a g-line ray, an i-line ray, an emission line from a krypton fluoride excimer laser, an emission line from an argon fluoride excimer laser, an electron beam (e-beam), and an X-ray.

16. The method of claim 15, wherein the developing of the exposed photoresist layer is performed using an aqueous solution comprising potassium hydroxide and/or tetramethyl ammonium hydroxide.

17. A method of manufacturing a display substrate comprising:

forming a gate metal pattern comprising a gate electrode, a gate line and a storage common line;

depositing a gate-insulating layer on the gate metal pattern;

sequentially forming an amorphous silicon layer and an n+ amorphous silicon layer on the gate-insulating layer to form a channel layer;

forming a source metal pattern comprising a source line, a source electrode and a drain electrode on the gate-insulating layer having the channel layer;

coating a photoresist resin composition on the source metal pattern and the gate insulating layer, the photoresist resin composition comprising about 10 to about 35% by weight of an acryl-based copolymer, about 5 to about 10% by weight of a quinone diazide compound, about 55 to about 80% by weight of a solvent, and about 0.01 to about 0.5% by weight of a silane-based surfactant represented by Chemical Formula (1):

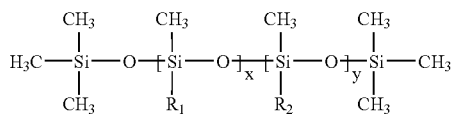

wherein $R_1$ represents an ethylene oxide group, $R_2$ represents a propylene oxide group, and X and Y represent integers of about 1 to about 20, and wherein the weights of each of the acryl-based copolymer, quinone diazide compound, solvent, and silane-based surfactant are based on the total weight of acryl-based copolymer, quinone diazide compound, solvent, and silane-based surfactant;

removing a portion of the photoresist resin composition and forming an overcoating layer having a contact hole exposing a portion of the drain electrode; and forming a pixel electrode electrically connected to the drain electrode through the contact hole.

18. The method of claim 17, wherein the acryl-based copolymer is prepared by copolymerizing monomers comprising about 5 to about 40% by weight of an unsaturated carboxylic acid, about 10 to about 70% by weight of an unsaturated compound containing an epoxy group, and about 10 to about 70% by weight of an unsaturated olefin-based compound, based on the total weight of the monomers.

19. The method of claim 17, further comprising forming a passivation layer between the source metal pattern and the overcoating layer.

20. The method of claim 17, wherein the overcoating layer has a convex-concave structure at an upper surface thereof.

21. The method of claim 17, wherein the forming of the overcoating layer comprises:

exposing the photoresist resin composition to light by using a mask having a predetermined pattern;

developing the exposed photoresist resin composition; and curing the developed photoresist resin composition at a temperature of about 150 to about 250° C.

* * * * *